US009159645B2

(12) United States Patent
Mori et al.

(10) Patent No.: US 9,159,645 B2
(45) Date of Patent: Oct. 13, 2015

(54) LIQUID-COOLED-TYPE COOLING DEVICE

(75) Inventors: Shogo Mori, Kariya (JP); Hideyasu Obara, Kariya (JP); Taizo Kuribayashi, Oyama (JP); Shinobu Tamura, Oyama (JP)

(73) Assignees: KABUSHIKI KAISHA TOYOTA JIDOSHOKKI, Kariya-shi (JP); SHOWA DENKO K.K., Tokyo (JP)

( * ) Notice: Subject to any disclaimer, the term of this patent is extended or adjusted under 35 U.S.C. 154(b) by 1281 days.

(21) Appl. No.: 12/546,149

(22) Filed: Aug. 24, 2009

(65) Prior Publication Data
US 2010/0051234 A1 Mar. 4, 2010

(30) Foreign Application Priority Data

Aug. 26, 2008 (JP) .................. 2008-216616

(51) Int. Cl.
F28F 7/00 (2006.01)
H01L 23/473 (2006.01)
F28F 3/02 (2006.01)
F28F 3/12 (2006.01)

(52) U.S. Cl.
CPC ............. H01L 23/473 (2013.01); F28F 3/025 (2013.01); F28F 3/12 (2013.01); F28F 2265/32 (2013.01); H01L 2924/0002 (2013.01)

(58) Field of Classification Search
CPC ............. F28F 2225/06; F28F 2240/00; F28F 2280/08; F28F 1/40; F28F 3/12
USPC ......... 165/80.4, 169, 170, 80.2; 361/699, 702
See application file for complete search history.

(56) References Cited

U.S. PATENT DOCUMENTS

| 4,002,200 | A | * | 1/1977 | Raskin ..................... 165/131 |
| 4,122,828 | A | * | 10/1978 | DiPeri ..................... 126/671 |
| 4,186,720 | A | * | 2/1980 | Schmauder et al. ......... 126/667 |
| 5,467,817 | A | * | 11/1995 | Schwald .................... 165/167 |
| 5,517,757 | A | * | 5/1996 | Hayashi et al. .......... 29/890.039 |

(Continued)

FOREIGN PATENT DOCUMENTS

DE    11 2006 000 957 T5    7/2008
JP         10-47879          2/1998

(Continued)

OTHER PUBLICATIONS

U.S. Appl. No. 12/911,357, filed Oct. 25, 2010, Mori, et al.

(Continued)

*Primary Examiner* — Marc Norman
*Assistant Examiner* — Devon Russell
(74) *Attorney, Agent, or Firm* — Oblon, McClelland, Maier & Neustadt, L.L.P.

(57) ABSTRACT

A liquid-cooled-type cooling device includes a casing having a cooling-liquid inlet and a cooling-liquid outlet. A fin for forming flow channels is disposed within the casing between the inlet and the outlet. A portion of the interior of the casing located rearward of the fin is an inlet header section, and a portion of the interior of the casing located frontward of the fin is an outlet header section. A rear side surface within the inlet header section is skewed toward the fin in a direction from the right side toward the left side. A positioning vertical surface extending straight along the left-right direction and positioning a rear end portion of the fin is provided on a lower portion of a left end portion of the rear side surface within the inlet header section. The rear end portion of the fin is in contact with the positioning vertical surface.

5 Claims, 4 Drawing Sheets

(56) References Cited

U.S. PATENT DOCUMENTS

| | | | |
|---|---|---|---|
| 6,098,703 A * | 8/2000 | Yoshii | 165/153 |
| 6,101,715 A * | 8/2000 | Fuesser et al. | 29/890.03 |
| 6,305,079 B1 * | 10/2001 | Child et al. | 29/890.039 |
| 6,948,557 B2 * | 9/2005 | Higashiyama et al. | 165/109.1 |
| 6,962,194 B2 * | 11/2005 | Martin et al. | 165/170 |
| 7,252,167 B2 * | 8/2007 | Nakamura et al. | 180/68.4 |
| 7,365,981 B2 * | 4/2008 | Myers et al. | 361/699 |
| 7,509,999 B2 * | 3/2009 | Angelis et al. | 165/247 |
| 7,569,957 B2 * | 8/2009 | Aoki et al. | 310/64 |
| 7,859,103 B2 * | 12/2010 | Aoki et al. | 257/714 |
| 8,371,365 B2 * | 2/2013 | Kesseli et al. | 165/167 |
| 2001/0014029 A1 * | 8/2001 | Suzuki et al. | 363/141 |
| 2002/0185260 A1 * | 12/2002 | Calaman et al. | 165/80.4 |
| 2003/0116311 A1 * | 6/2003 | Fitzpatrick et al. | 165/170 |
| 2006/0225867 A1 * | 10/2006 | Park et al. | 165/80.4 |
| 2007/0056720 A1 * | 3/2007 | Demuth et al. | 165/158 |
| 2009/0065178 A1 * | 3/2009 | Kasezawa et al. | 165/104.19 |
| 2009/0178792 A1 | 7/2009 | Mori et al. | |
| 2009/0314474 A1 * | 12/2009 | Kimbara et al. | 165/104.33 |

FOREIGN PATENT DOCUMENTS

| | | | | |
|---|---|---|---|---|
| JP | 2000-55583 | | 2/2000 | |
| JP | 2001-352025 | | 12/2001 | |
| JP | 2004-60920 | | 2/2004 | |
| JP | 2006-295178 | | 10/2006 | |
| WO | WO 2005/038375 | A1 | 4/2005 | |
| WO | WO 2005038375 | A1 * | 4/2005 | F28D 7/16 |
| WO | WO 2007105580 | A1 * | 9/2007 | H01L 25/07 |

OTHER PUBLICATIONS

U.S. Appl. No. 12/740,024, filed Apr. 27, 2010, Mori, et al.
International Search Report issued Aug. 3, 2010 in EP Application No. 09168644.4-1235.
U.S. Appl. No. 12/546,423, filed Aug. 24, 2009, Mori, et al.
Office Action issued Jan. 24, 2012 in Japan Application No. 2008-216616.

* cited by examiner

LIQUID-COOLED-TYPE COOLING DEVICE

BACKGROUND OF THE INVENTION

The present invention relates to a liquid-cooled-type cooling device for cooling a heat-generating body composed of an electronic component such as a semiconductor device.

In the present specification and appended claims, the side toward which cooling liquid flows within flow channels formed by a fin (the lower side of FIG. 3) will be referred to as "front," and the opposite side will be referred to as "rear." Also, the upper, lower, left-hand, and right-hand sides of FIG. 2 will be referred to as "upper," "lower," "left," and "right," respectively.

There has been conventionally known a liquid-cooled-type cooling device for electronic components (see Japanese Patent Application Laid-Open (kokai) No. 2001-352025). The known liquid-cooled-type cooling device includes a casing which is composed of a top wall, a bottom wall, and a peripheral wall and which has a cooling-liquid inlet formed at a rear end portion of the casing and a cooling-liquid outlet formed at a front end portion of the casing. A fin for forming a plurality of flow channels through which a cooling liquid flows from the rear side toward the front side is disposed within the casing to be located between the cooling-liquid inlet and the cooling-liquid outlet. A portion of the interior of the casing located rearward of the fin serves as an inlet header section which communicates with the cooling-liquid inlet, and a portion of the interior of the casing located frontward of the fin serves as an outlet header section which communicates with the cooling-liquid outlet. A heat-generating-body mounting region is provided on the outer surface of the top wall of the casing and/or the outer surface of the bottom wall of the casing.

However, the liquid-cooled-type cooling device disclosed in the above-mentioned publication has a problem in that the position of the fin may shift in the front-rear direction at the time of manufacture of the cooling device, and, therefore, the fin cannot be accurately disposed at a predetermined position.

SUMMARY OF THE INVENTION

An object of the present invention is to solve the above-mentioned problem and to provide a liquid-cooled-type cooling device which can reliably prevent positional shift of the fin of which shift would otherwise occur when the cooling device is manufactured.

To achieve the above object, the present invention comprises the following modes.

1) A liquid-cooled-type cooling device comprising a casing which has a cooling-liquid inlet formed at a rear end portion of the casing and a cooling-liquid outlet formed at a front end portion of the casing, in which a fin for forming a plurality of flow channels through which a cooling liquid flows from a rear side toward a front side is disposed within the casing to be located between the cooling-liquid inlet and the cooling-liquid outlet, a portion of the interior of the casing located rearward of the fin serves as an inlet header section communicating with the cooling-liquid inlet, and a portion of the interior of the casing located frontward of the fin serves as an outlet header section communicating with the cooling-liquid outlet, wherein a rear side surface within the inlet header section is skewed toward the fin in a direction from one of left and right sides toward the other side;

a positioning vertical surface which extends straight along a left-right direction and which positions a rear end portion of the fin is provided on a lower portion or an upper portion of an end portion of the rear side surface within the inlet header section, the end portion being closest to the fin; and the rear end portion of the fin is contact with the positioning vertical surface.

2) A liquid-cooled-type cooling device according to par. 1), wherein a height of the positioning vertical surface is equal to or less than half a height within the inlet header section; and a clearance through which a cooling liquid flows is formed between the rear end portion of the fin and a portion of the end portion of the rear side surface within the inlet header section closest to the fin, the portion being located above or below the positioning vertical surface.

3) A liquid-cooled-type cooling device according to par. 1), wherein a front side surface within the outlet header section is skewed toward the fin in a direction from one of the left and right sides toward the other side;

a positioning vertical surface which extends straight along the left-right direction and which positions a front end portion of the fin is provided on a lower portion or an upper portion of an end portion of the front side surface within the outlet header section, the end portion being closest to the fin; and the front end portion of the fin is contact with the positioning vertical surface.

4) A liquid-cooled-type cooling device according to par. 3), wherein a height of the positioning vertical surface is equal to or less than half a height within the outlet header section; and a clearance through which the cooling liquid flows is formed between the front end portion of the fin and a portion of the end portion of the front side surface within the out header section closest to the fin, the portion being located above or below the positioning vertical surface.

5) A liquid-cooled-type cooling device according to par. 1), wherein left and right side surfaces within the casing extend along left and right side edges, respectively, of the fin; and a recess portion which swells outward with respect to the left-right direction is provided on each of portions of the left and right side surfaces within the casing, the portions connecting with the respective positioning vertical surfaces.

According to the liquid-cooled-type cooling device of par. 1), a rear side surface within the inlet header section is skewed toward the fin in a direction from one of the left and right sides toward the other side; a positioning vertical surface which extends straight along a left-right direction and which positions a rear end portion of the fin is provided on a lower portion or an upper portion of an end portion of the rear side surface within the inlet header section, the end portion being closest to the fin; and the rear end portion of the fin is contact with the positioning vertical surface. Therefore, even in the case where the rear side surface within the inlet header section is skewed toward the fin in a direction from one of the left and right sides toward the other side and positioning projections or the like cannot be formed on the top wall or the bottom wall of the casing, rearward positional shift of the fin can be prevented by making use of the positioning vertical surface during manufacture of the cooling device. Notably, frontward positional shift of the fin is prevented by proper means such as a projection provided on the inner surface of the top wall of the casing and/or the inner surface of the bottom wall of the casing. Accordingly, the fin can be accurately disposed at a predetermined position. In order to render uniform the flow velocities within a plurality of flow channels arranged in the width direction, for example, the cooling device is desirably configured such that a cooling-liquid inlet is formed in the left or right end portion of the casing and the rears side surface within the inlet header section is skewed toward the fin in a direction from a cooling-liquid inlet side end portion to the other end portion. Even in such a case, rearward positional shift of the fin can be prevented by making use of the positioning vertical surface during manufacture of the cooling device.

According to the liquid-cooled-type cooling device of par. 2), the height of the positioning vertical surface is equal to or less than half the height within the inlet header section; and a clearance through which a cooling liquid flows is formed between the rear end portion of the fin and a portion of the end portion of the rear side surface within the inlet header section closest to the fin, the portion being located above or below the positioning vertical surface. Therefore, it is possible to prevent a considerable drop in the flow velocity of the cooling liquid flowing through flow channels in a region where the positioning vertical surface is formed, among the flow channels, which are formed by the fin and extend in the front-rear direction.

According to the liquid-cooled-type cooling device of par. 3), a front side surface within the outlet header section is skewed toward the fin in a direction from one of the left and right sides toward the other side; a positioning vertical surface which extends straight along the left-right direction and which positions a front end portion of the fin is provided on a lower portion or an upper portion of an end portion of the front side surface within the outlet header section, the end portion being closest to the fin; and the front end portion of the fin is contact with the positioning vertical surface. Therefore, even in the case where the front side surface within the outlet header section is skewed toward the fin in a direction from one of the left and right sides toward the other side and positioning projections or the like cannot be formed on the top wall or the bottom wall of the casing, frontward positional shift of the fin can be prevented by making use of the positioning vertical surface during manufacture of the cooling device. Accordingly, the fin can be accurately disposed at a predetermined position.

According to the liquid-cooled-type cooling device of par. 4), the height of the positioning vertical surface is equal to or less than half the height within the outlet header section; and a clearance through which the cooling liquid flows is formed between the front end portion of the fin and a portion of the end portion of the front side surface within the out header section closest to the fin, the portion being located above or below the positioning vertical surface. Therefore, it is possible to prevent a considerable drop in the flow velocity of the cooling liquid flowing through flow channels in a region where the positioning vertical surface is formed, among the flow channels, which are formed by the fin and extend in the front-rear direction.

According to the liquid-cooled-type cooling device of par. 5), the left and right side surfaces within the casing extend along the left and right side edges, respectively, of the fin; and a recess portion which swells outward with respect to the left-right direction is provided on each of portions of the left and right side surfaces within the casing, the portions connecting with the respective positioning vertical surfaces. Therefore, even in the case where the casing is press-formed, interference between corner portions of the fin and the inner surfaces of the left and right side walls of the casing can be avoided in a state where the clearances between the positioning vertical surfaces and the fin are minimized.

DESCRIPTION OF THE PREFERRED EMBODIMENT

A preferred embodiment of the present invention will next be described with reference to the drawings.

In the following description, the term "aluminum" encompasses aluminum alloys in addition to pure aluminum.

Figure 1:
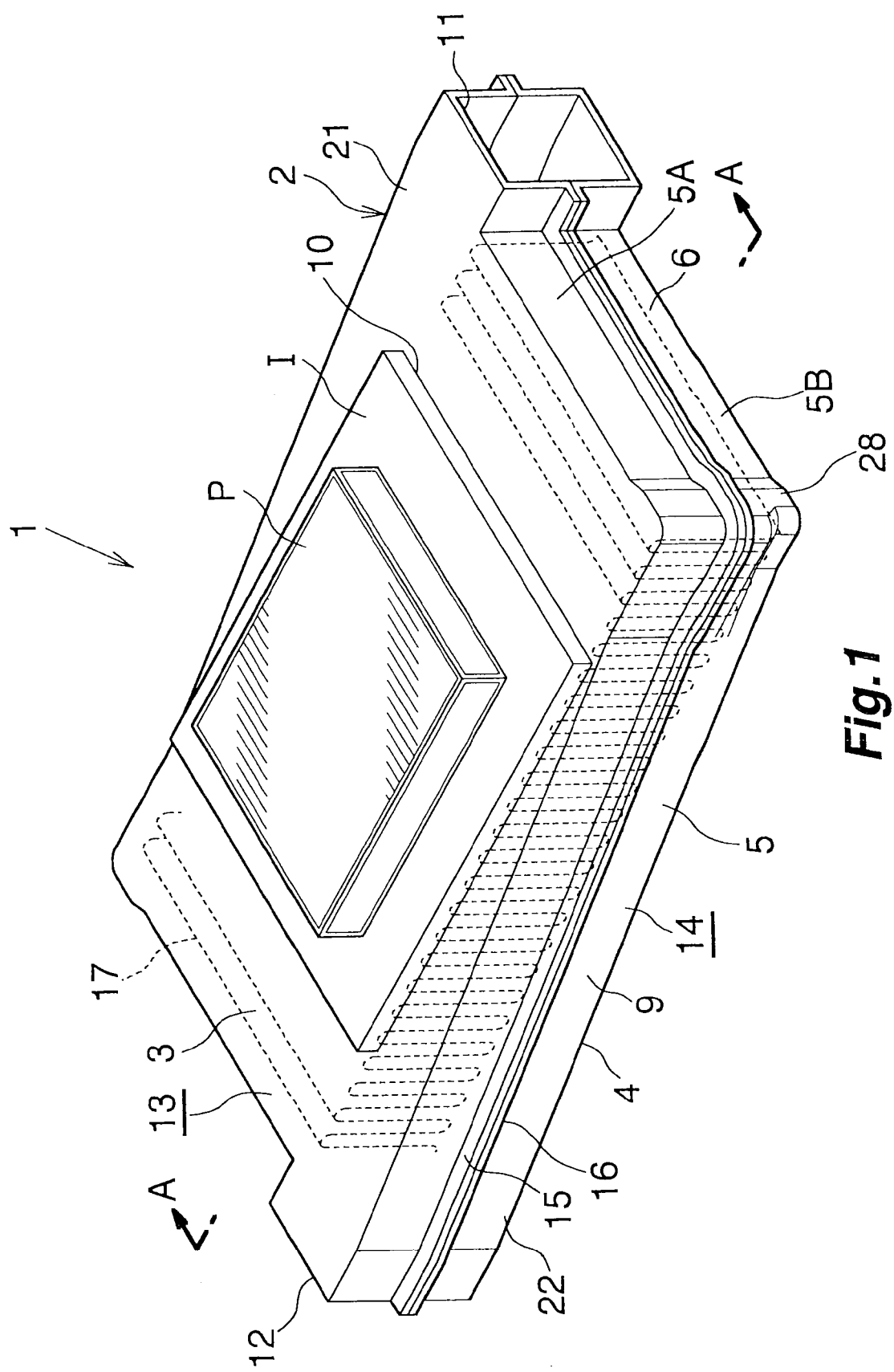
FIG. 1 is a perspective view showing a liquid-cooled-type cooling device according to the present invention.
Figure 2:
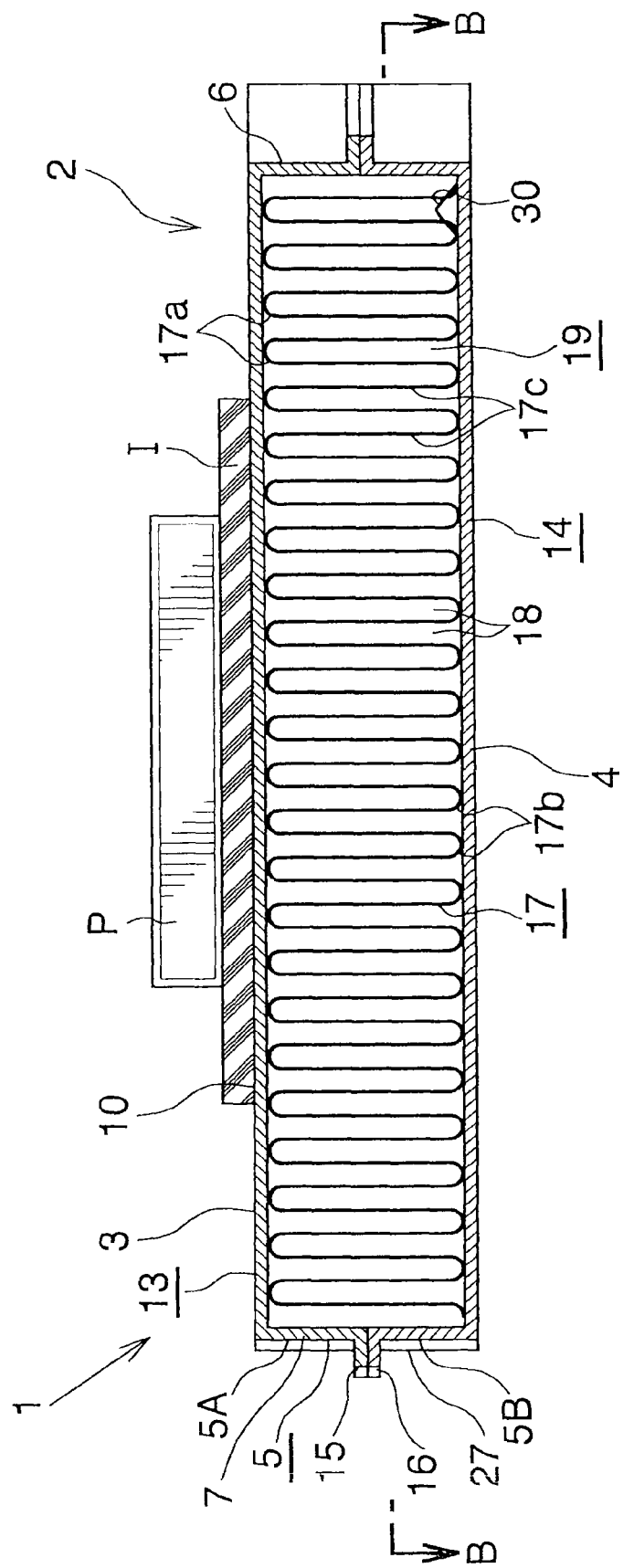
FIG. 2 is a sectional view taken along line A-A of FIG. 1.
Figure 3:
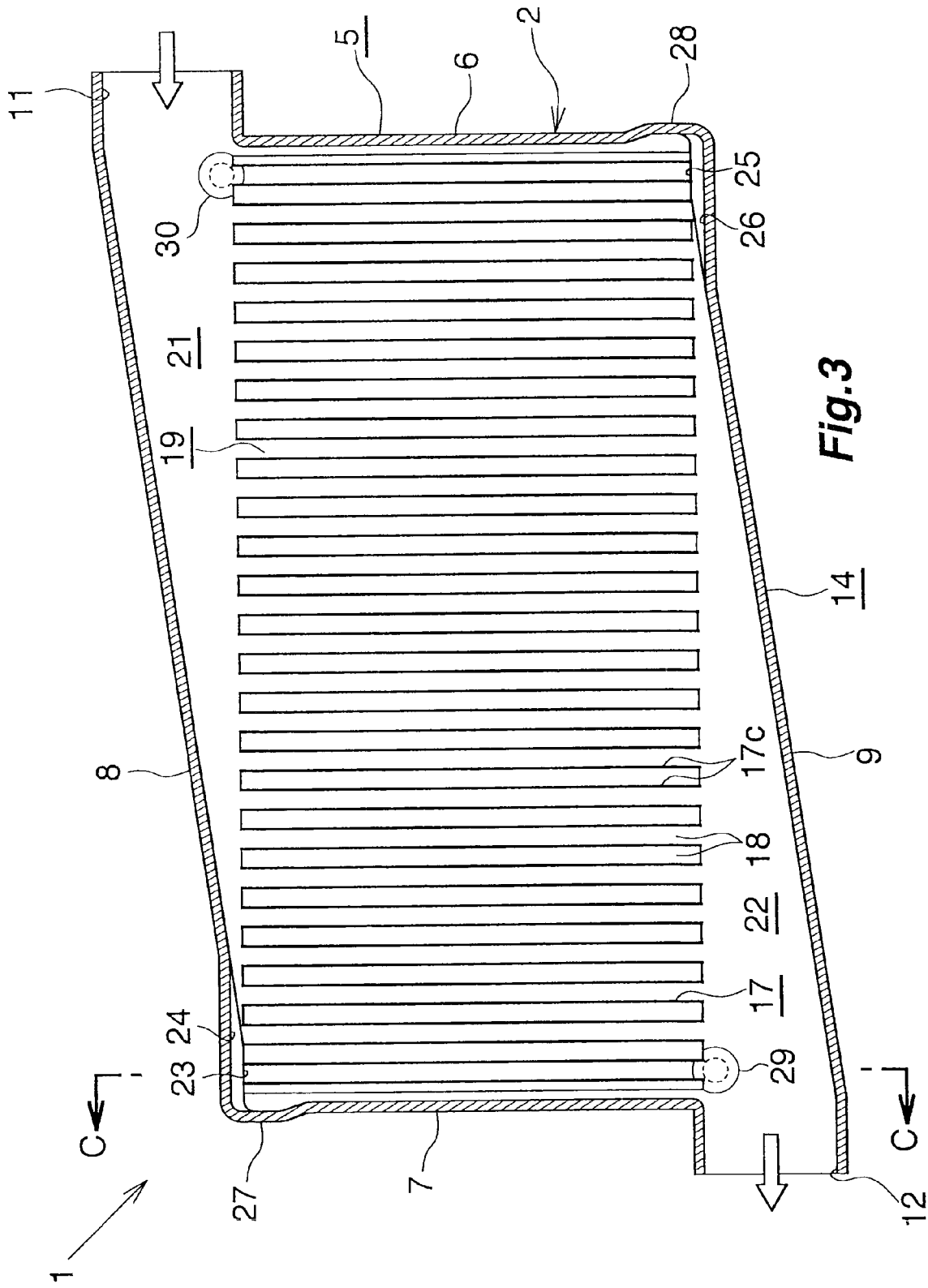
FIG. 3 is a sectional view taken along line B-B of FIG. 2.
Figure 4:
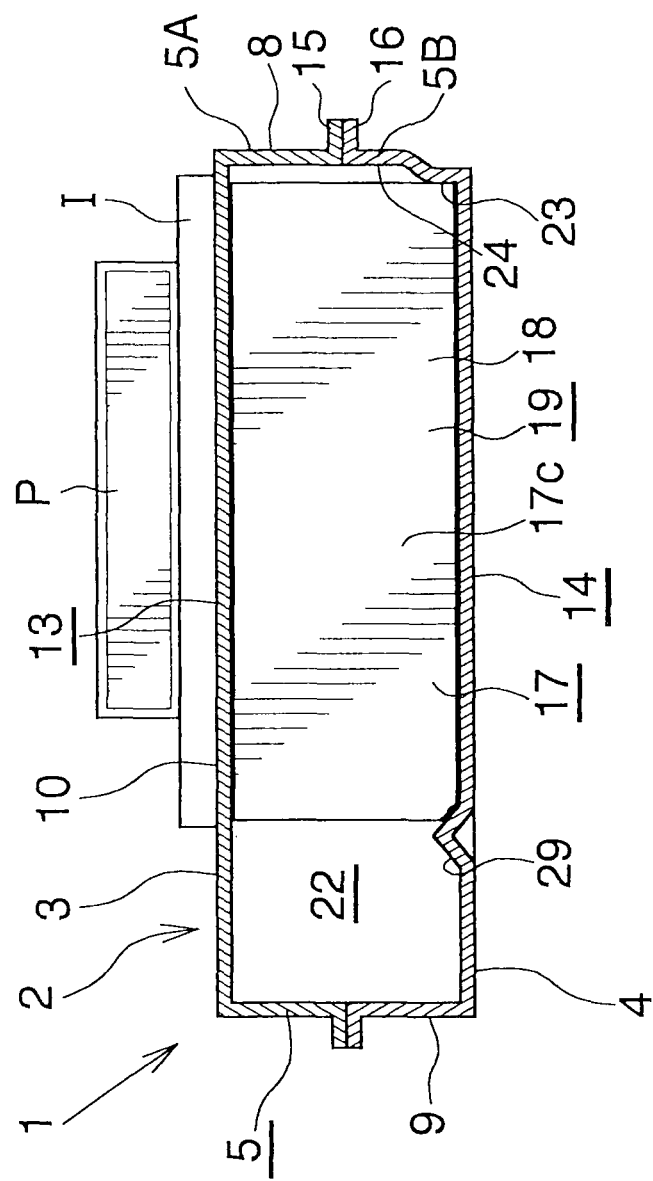
FIG. 4 is a sectional view taken along line C-C of FIG. 3.

FIGS. 1 to 4 show a state in which a semiconductor device, which is a heat-generating body, is mounted on a liquid-cooled-type cooling device according to the present invention.

In FIGS. 1 to 4, a liquid-cooled-type cooling device 1 has a casing 2 composed of a top wall 3, a bottom wall 4, and a peripheral wall 5. A heat-generating-body mounting region 10 is provided on the outer surface of the top wall 3 of the casing 2. The peripheral wall 5 of the casing 2 includes a right side wall 6, which extends in the front-rear direction and stands vertically; a left side wall 7, which extends in the front-rear direction, stands vertically, and is positioned in opposition to the right side wall 6; a rear side wall 8, which connects rear end portions of the right and left side walls 6 and 7 and stands vertically; and a front side wall 9, which connects front end portions of the right and left side walls 6 and 7 and stands vertically. In the peripheral wall 5 of the casing 2, a cooling-liquid inlet 11 is formed at a rear end portion of the right side wall 6 in a rightward projecting condition, and a cooling-liquid outlet 12 is formed at a front end portion of the left side wall 7 in a leftward projecting condition. The cooling-liquid inlet 11 opens rightward, whereas the cooling-liquid outlet 12 opens leftward. The casing 2 is formed of an upper structure member 13 of aluminum and a lower structure member 14 of aluminum. The upper structure member 13 includes the top wall 3 and an upper peripheral-wall-formation section 5A, which serves as an upper half of the peripheral wall 5. The lower structure member 14 includes the bottom wall 4 and a lower peripheral-wall-formation section 5B, which serves as a lower half of the peripheral wall 5. A lower end portion of the upper peripheral-wall-formation section 5A of the upper structure member 13 and an upper end portion of the lower peripheral-wall-formation section 5B of the lower structure member 14 have integrally formed outward flanges 15 and 16, respectively. The outward flanges 15 and 16 of the upper and lower structure members 13 and 14 are brazed together. Each of the upper structure member 13 and the lower structure member 14 is formed from an aluminum blank plate through press working.

An aluminum corrugated fin 17 is disposed in an internal region of the casing 2 located between the right side wall 6 and the left side wall 7 and between the cooling-liquid inlet 11 and the cooling-liquid outlet 12. The corrugated fin 17 includes wave crest portions 17a extending in the front-rear direction, wave trough portions 17b extending in the front-rear direction, and vertical connection portions 17c connecting the respective wave crest portions 17a and wave trough portions 17b. The wave crest portions 17a are brazed to the top wall 3 of the casing 2, whereas the wave trough portions 17b are brazed to the bottom wall 4 of the casing 2. The corrugated fin 17 forms a plurality of flow channels 18 which extend in the front-rear direction and are arranged in the left-right direction and through which cooling liquid flows from the rear side toward the front side, thereby providing a parallel-flow-channel section 19 including a plurality of flow channels.

A portion of the interior of the casing 2 located upstream (rearward) of the parallel-flow-channel section 19 serves as an inlet header section 21 communicating with the cooling-liquid inlet 11. A portion of the interior of the casing 2 located downstream (frontward) of the parallel-flow-channel section 19 serves as an outlet header section 22 communicating with the cooling-liquid outlet 12. The internal height of the entire casing 2 is uniform; i.e., the inlet header section 21, the outlet header section 22, and the parallel-flow-channel section 19 have the same height. The inner surface of the rear side wall 8 of the casing 2; that is, the rear side surface within the inlet header section 21, is smoothly skewed frontward (toward the corrugated fin 17) in a direction from the side toward the right side wall 6 to the side toward the left side wall 7. Further, the inner surface of the front side wall 9 of the casing 2; that is, the front side surface within the outlet header section 22, is smoothly skewed rearward (toward the corrugated fin 17) in a direction from the side toward the left side wall 7 to the side toward the right side wall 6.

A positioning vertical surface 23 which extends straight in the left-right direction and which positions a rear end portion of a left side edge portion of the corrugated fin 17 is provided on a lower portion of a left end portion (an end portion closest to the corrugated fin 17) of the inner surface of the rear side wall 8 of the casing 2; that is, the rear side surface within the inlet header section 21. The height of the positioning vertical surface 23 is equal to or less than half the height within the inlet header section 21, so that a clearance 24, through which the cooling liquid flows, is formed between the rear end portion of the corrugated fin 17 and a portion of the left end portion of the rear side surface within the inlet header section 21, which portion is located above the positioning vertical surface 23. A positioning vertical surface 25 which extends straight in the left-right direction and which positions a front end portion of a right side edge portion of the corrugated fin 17 is provided on a lower portion of a right end portion (an end portion closest to the corrugated fin 17) of the inner surface of the front side wall 9 of the casing 2; that is, the front side surface within the outlet header section 22. The height of the positioning vertical surface 25 is equal to or less than half the height within the outlet header section 22, so that a clearance 26, through which the cooling liquid flows, is formed between the front end portion of the corrugated fin 17 and a portion of the right end portion of the front side surface within the outlet header section 22, which portion is located above the positioning vertical surface 25. Further, the left and right side walls 7 and 6 of the casing 2 extend along the left and right side edges of the corrugated fin 17. A recess portion 27 which swells outward with respect to the left-right direction is provided on a portion of the inner surface of the left side wall 7 of the casing 2, the portion connecting with the positioning vertical surface 23 on the side toward the inlet header section 21. Similarly, a recess portion 28 which swells outward with respect to the left-right direction is provided on a portion of the inner surface of the right side wall 6 of the casing 2, the portion connecting with the positioning vertical surface 25 on the side toward the outlet header section 22. The positioning vertical surfaces 23 and 25 and the recess portions 27 and 28 are formed on the lower peripheral-wall-formation section 5B when the lower structure member 14 is formed through press working.

A projection 29 is provided on the inner surface of the bottom wall 4 of the casing 2 at a position located at the left end of the outlet header section 22. The projection 29 comes into contact with the front end portion of the corrugated fin 17 to thereby position the corrugated fin 17 in the front-rear direction in cooperation with the positioning vertical surface 23 of the rear side wall 8. Similarly, a projection 30 is provided on the inner surface of the bottom wall 4 of the casing 2 at a position located at the right end of the inlet header section 21. The projection 30 comes into contact with the rear end portion of the corrugated fin 17 to thereby position the corrugated fin 17 in the front-rear direction in cooperation with the positioning vertical surface 25 of the front side wall 9. The projections 29 and 30 are formed by means of deforming the bottom wall 4 when the lower structure member 14 is formed through press working, and assume the form of a circular cone whose diameter decreases toward the tip end thereof.

A semiconductor device P, which is a heat-generating body, is joined to the outer surface of the top wall 3 of the casing 2 via a plate-shaped insulating member I to be located in the heat-generating-body mounting region 10.

In the liquid-cooled-type cooling device 1 having the above-described configuration, the cooling liquid having flowed into the inlet header section 21 through the cooling-liquid inlet 11 flows into all of the flow channels 18 of the parallel-flow-channel section 19 in a uniformly divided condition, and flows frontward through the flow channels 18. At that time, since the clearance 24, through which the cooling liquid flows, is formed between the rear end portion of the corrugated fin 17 and a portion of the left end portion of the inner surface of the rear side wall 8 of the casing 2, which portion is located above the positioning vertical surface 23, it is possible to prevent a considerable drop in the flow velocity of the cooling liquid flowing through flow channels 18 in a region where the positioning vertical surface 23 is formed, among all the flow channels 18, which are formed by the corrugated fin 17 and extend in the front-rear direction.

The cooling liquid having flowed frontward through the flow channels 18 of the parallel-flow-channel section 19 enters the outlet header section 22, flows leftward through the outlet header section 22, and flows out of the casing 2 via the cooling-liquid outlet 12. At that time, since the clearance 26, through which the cooling liquid flows, is formed between the front end portion of the corrugated fin 17 and the right end portion (excluding the positioning vertical surface 25) of the inner surface of the front side wall 9 of the casing 2, it is possible to prevent a considerable drop in the flow velocity of the cooling liquid flowing through flow channels 18 in a region where the positioning vertical surface 25 is formed, among all the flow channels 18, which are formed by the corrugated fin 17 and extend in the front-rear direction.

Heat generated from the semiconductor device P is transmitted to the cooling liquid which flows through the flow channels 18, via the insulating member I, the top wall 3 of the casing 2, and the corrugated fin 17. The semiconductor device P is thus cooled.

In the above-described embodiment, the projections 29 and 30 are provided on the inner surface of the bottom wall 4 of the casing 2; however, the surface on which the projections 29 and 30 are provided is not limited thereto, and the projections may be provided on the inner surface of the top wall 3. Alternatively, the projections may be provided on both the inner surface of the top wall 3 and the inner surface of the bottom wall 4.

What is claimed is:
1. A liquid-cooled-type cooling device comprising:
 a casing which has a peripheral wall including left, right front and rear side walls defining an interior of the casing, the casing further including a cooling-liquid inlet formed at a rear end portion of the casing and a cooling-liquid outlet formed at a front end portion of the casing;

a fin for forming a plurality of flow channels arranged in a left-right direction and through which a cooling liquid flows in the front-rear direction, the fin being disposed within the interior of the casing to be located between the cooling-liquid inlet and the cooling-liquid outlet;

a portion of the interior of the casing located rearward of the fin and which serves as an inlet header section communicating with the cooling-liquid inlet;

a portion of the interior of the casing located frontward of the fin and which serves as an outlet header section communicating with the cooling-liquid outlet;

wherein a rear side surface of the rear sidewall within the inlet header section is skewed toward the fin such that the inlet header section is tapered in a direction from the cooling liquid inlet toward one of the left and right sidewalls of the casing that is opposite to the cooling liquid inlet;

wherein the fin is a corrugated fin including a plurality of wave crest portions extending in the front-rear direction of the casing, a plurality of respective wave trough portions extending in the front-rear direction, and a plurality of vertical connection portions each connecting a wave crest portion to a respective wave trough portion;

wherein said rear side wall includes a first positioning vertical surface which extends straight along the left-right direction and which positions a rear end portion of the fin and is provided on a lower portion or an upper portion of an end portion of a rear side surface within the inlet header section, the end portion being closest to the fin such that a rear end portion of the plurality of vertical connection portions of the fin is in contact with the first positioning vertical surface such that only a portion of the vertical dimension of the vertical connection portions contacts the first vertical positioning surface and a remaining portion of the vertical dimension of the vertical connections portion defines a flow gap with an opposing portion of the rear side surface, and wherein the cooling-liquid inlet is provided on one of the left and right side walls of the peripheral wall and the first positioning vertical surface is provided at the end portion opposite to the side wall where the cooling-liquid inlet is provided;

wherein the cooling-liquid outlet is provided on the side wall opposite to the side wall where a cooling-liquid inlet is provided and the second positioning vertical surface is provided at the end portion opposite to the side wall where a cooling-liquid outlet is provided.

2. A liquid-cooled-type cooling device according to claim 1, wherein a height of each positioning vertical surface is equal to or less than half a height within its respective header section.

3. A liquid-cooled-type cooling device according to claim 1, wherein left and right side surfaces within the casing extend along left and right side edges, respectively, of the fin; and a recess portion which swells outward with respect to the left-right direction is provided on each of portions of the left and right side surfaces within the casing, the portions connecting with the respective positioning vertical surfaces.

4. A liquid-cooled-type cooling device according to claim 1, wherein a clearance through which a cooling liquid flows is formed to communicate with the channels formed by the fins, between the rear end portion of the fin and a portion of the end portion of the rear side surface within the inlet header section closest to the fin, the portion being located above or below the positioning vertical surface.

5. A liquid-cooled-type cooling device according to claim 1, wherein a clearance through which a cooling liquid flows is formed to communicate with the channels formed by the fins, between the front end portion of the fin and a portion of the end portion of the front side surface within the outlet header section closest to the fin, the portion being located above or below the positioning vertical surface.

* * * * *